United States Patent
Mawatari

(10) Patent No.: US 8,587,122 B2
(45) Date of Patent: Nov. 19, 2013

(54) SEMICONDUCTOR FLIP-CHIP SYSTEM HAVING THREE-DIMENSIONAL SOLDER JOINTS

(75) Inventor: Kazuaki Mawatari, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 156 days.

(21) Appl. No.: 13/220,336

(22) Filed: Aug. 29, 2011

(65) Prior Publication Data

US 2013/0049189 A1   Feb. 28, 2013

(51) Int. Cl.
  *H01L 23/48* (2006.01)
  *H01L 23/52* (2006.01)
  *H01L 29/40* (2006.01)

(52) U.S. Cl.
  USPC ............ 257/773; 257/775; 257/779

(58) Field of Classification Search
  USPC ......... 257/780, 781, 737, 738, 773, 775, 779
  See application file for complete search history.

(56) References Cited

U.S. PATENT DOCUMENTS

| | | | |
|---|---|---|---|
| 2009/0072385 A1* | 3/2009 | Alley et al. | 257/713 |
| 2010/0193944 A1* | 8/2010 | Castro et al. | 257/737 |
| 2012/0098120 A1* | 4/2012 | Yu et al. | 257/737 |
| 2012/0326170 A1* | 12/2012 | Liu et al. | 257/82 |
| 2013/0062755 A1* | 3/2013 | Kuo et al. | 257/737 |

* cited by examiner

*Primary Examiner* — S. V. Clark
(74) *Attorney, Agent, or Firm* — Steven A. Shaw; W. James Brady; Frederick J. Telecky, Jr.

(57) ABSTRACT

A solder joint between a trace (401) and an object (501). The trace having a solderable surface (503), a height (504), and a width (404), the trace including a bulge having a diameter (502) greater than the trace width, a surface area, and sidewalls, the sum of the bulge sidewall areas being no less than the bulge surface area. The object having a solderable surface (503), a diameter (502) greater than the trace width. One end of the object soldered to the bulge, wherein the solder (610, 611, 612) adheres to the bulge surface area and the bulge sidewall areas.

14 Claims, 2 Drawing Sheets

US 8,587,122 B2

SEMICONDUCTOR FLIP-CHIP SYSTEM HAVING THREE-DIMENSIONAL SOLDER JOINTS

FIELD OF THE INVENTION

The present invention is related in general to the field of semiconductor devices and processes, and more specifically to the structure and fabrication method of a system with a semiconductor chip connected by metal pillars to substrate traces designed for fine pitch interconnect and reliable, high stress tolerance solder joints.

DESCRIPTION OF RELATED ART

Electronic applications such as handheld telephones and other wireless products offer the customer an ever increasing number of features, while the sizes of the telephones and other products keep shrinking. As a consequence, there is an ongoing trend for the semiconductor devices inside these products to miniaturize the size of the devices while increasing the number of functional device terminals. The shrinking device dimensions at increasing terminal numbers translate into ever finer pitch of the interconnections used by these devices. Today, the preferred technology for interconnecting a semiconductor chip to a substrate is by forming metallic bumps on the chip, then to flip the chip and solder-attach it onto the substrate. Likewise, the preferred technology for interconnecting a packaged device to a board is by using solder balls for flip-attaching the device to the board.

An emerging option for fine-pitch flip-chip interconnect utilizes circular copper bumps or elongated metal (copper) pillars of circular cross section, plated onto the terminals (bond-pads) of the semiconductor chip. The bumps are then connected with solder to the copper traces of the substrate. An advantage of this approach is the possibility to fabricate the copper bumps in a wafer-level process; the photoresist technology used in this process determines the aspect ratio (height and diameter) of the bumps or pillars.

In an example of existing technology for fine pitch flip-chip interconnect, copper bumps or pillars of 30 µm diameter, or cubic-shaped bumps of 30 µm side length are employed, which have been plated onto the bond-pads of a semiconductor chip. The substrate has straight copper traces of 30 µm width and 17 µm height. Solder balls of at least 30 µm diameter are used to connect the 30 µm bumps to the 30 µm wide traces; the contact area is approximately 900 µm$^2$ (30 µm by 30 µm). Analogous considerations apply to other examples of devices with bumps close to the present technical limit in mass production (bump diameter approximately 25 µm).

SUMMARY OF THE INVENTION

In evaluating assembly failures, applicant observed as failure symptoms partial or complete cracks in the solder connections between copper bumps, or pillars, and copper traces. Specifically, applicant found, when vertical metal pillars with solder tips are reflowed onto horizontal metal traces, the risk of cracks in solder connections increases with decreasing solder joint thickness. Failures multiply for fine pitch pillars. The cracks seemed numerous enough to jeopardize considerations of shrinking the bump diameter or the trace width.

In a more detailed analysis, applicant discovered as the root cause of the failures that in most crack incidents the solder joint thickness had decreased due to loss of solder by lateral wicking along the trace surface area.

Applicant solved the risk of solder cracking by narrowing the trace width relative to the contact diameter in order to diminish the horizontal trace surface available for solder loss by horizontal wicking, while concurrently giving the trace contact area a bulge of a diameter greater than the trace width and further sidewalls with a contour so that the sum of the bulge sidewall areas is no less than the bulge surface area. Consequently, at the process step of attaching the bump or pillar, vertical solder wicking at the sidewalls incorporates the sidewalls of the bulge into the solder joint.

A series of experiments showed that in a preferred embodiment the trace width may be about 60% to 70% narrower than the bump or pillar diameter. However, the bulge as the trace contact area has preferably a meandrous contour such as a double cross, or a diamond or an ellipse, with a diameter about equal to the bump or pillar diameter. With a meandrous contour, the bulge perimeter may be considerably longer than a circular perimeter, intentionally enlarging the sum of the sidewall areas. As a result, the effective solder contact area at the bulge contact, as the sum of the bulge surface area and the bulge sidewall areas, may increase to approximately 1900 µm$^2$ from the conventional contact area of about 900 µm$^2$ quoted above for 30 µm bumps on 30 µm wide traces. Contacts with solder adhering to this enlarged area produce strong bonds; they have been found to be superior to conventional contacts in pull and shear tests and other stress tests.

In a preferred embodiment, the trace is made of copper and its surface kept free of contaminants; the bump or pillar is also made of copper with a solder cap on the pillar tip. Further, the trace is laid out so that the trace height is about equal to the trace width, which is about 60% narrower than the bump or pillar diameter.

DETAILED DESCRIPTION OF THE PREFERRED EMBODIMENTS

Figure 1:
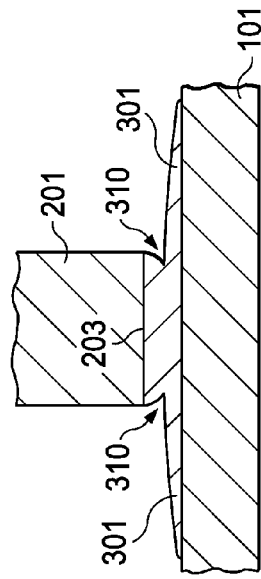
FIG. 1 (prior art) is a top view of a conductive trace with a solder-capped bump positioned above the trace at some distance.
Figure 2:
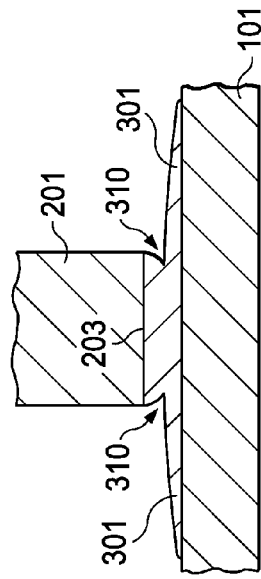
FIG. 2 (prior art) is a cross section through FIG. 1 along the cutaway-line indicated in FIG. 1. A solder-capped bump is positioned above a conductive trace.
Figure 3:
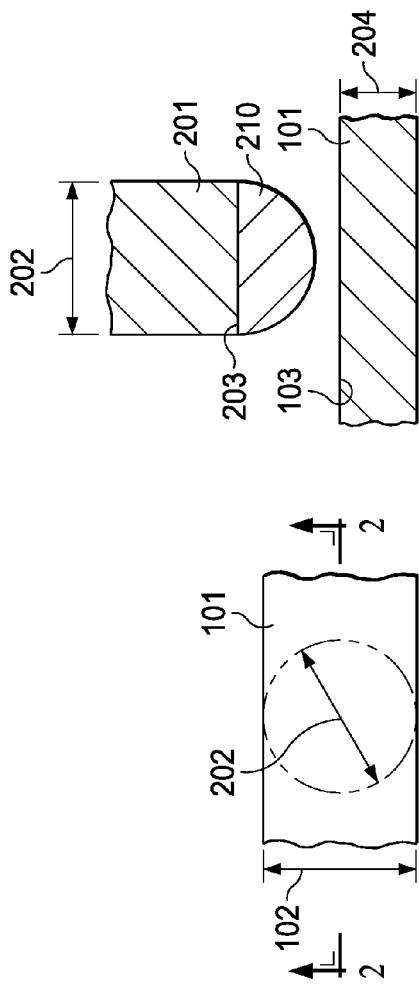
FIG. 3 (prior art) shows a cross section of bump and trace of FIG. 2 in contact after the solder reflowed, depicting horizontal solder wicking along the trace surface.

FIGS. 1, 2, and 3 display a contact formation between two conductors in existing technology. A trace 101 of width 102 has a solderable surface and may have a conductive composition; furthermore, trace 101 has a height 204. Trace 101 is stretched horizontally and may be supported by a substrate. Trace 101 is to be contacted by a solderable, and possibly conductive pillar 201 of diameter 202, which is oriented approximately vertically relative to conductor 101. As an example, width 102 may be 30 μm or more; height 204 may be about 17 μm. Width 102 and diameter 202 are typically selected so that diameter 202 is smaller or at least no wider than width 102. In an example, wherein the pillar has a square-shaped cross section of 30 μm side length and the side length of the pillar is equal to the width of the trace, the projected contact area is 900 μm².

As used herein, the term pillar refers to a broad family of bodies suitable for connecting from a unit to external parts. Other terms frequently employed include post, bumps, and pad. Usually, the bodies are electrically conductive and thus made of a metal or an alloy; they may, however, include other materials such conductive adhesives, z-axis conductors, carbon nanotubes.

Solder is commonly used as a means for creating the contact between pillar and trace. Frequently, the needed solder is preplated on the surface 103 of trace 101. In other cases, as displayed in FIGS. 1, and 2, supplied as a cap 210 on the end 203 of pillar the needed solder is 201. In these latter cases, the liquified solder tends to spread after touch-down widely across solderable surface 103 after the touchdown of pillar 201 on trace 101. This action, caused by adhesive forces on the trace surface 103, is commonly known as solder wicking.

In FIG. 3, the wicking is laterally along the area of the trace surface 103. The laterally wicking solder, designated 301 in FIG. 3, consumes large fractions of the available solder material, decreases the solder joint thickness, and thus deprives the contact between pillar 201 and trail 101 of solder material intended for reliable connection. As a consequence, a solder constriction called necking (designated 310) develops frequently close to pillar ends 203. Devices with this problem of reduced contact are liable to fail in quality and reliability tests involving standardized shear tests, pull tests, and temperature cycling stress tests. The failure symptom typically is solder cracking. The failure rate increases strongly for devices with reduced amount of solder, decreasing solder joint thickness, smaller contact area (fine pitch pillars), or generally shrinking dimensions.

Figure 4:
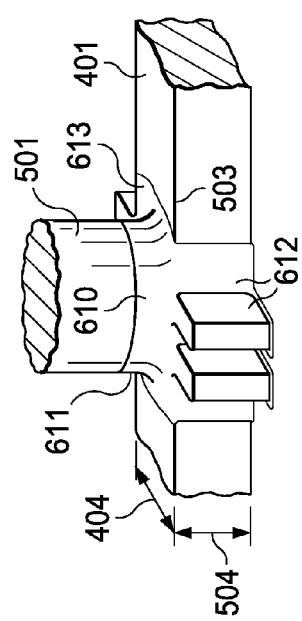
FIG. 4 shows a top view of an embodiment of the invention, illustrating a solderable trace with a bulge configured according to the invention, and a solder-capped object positioned above the trace at some distance.
Figure 5:
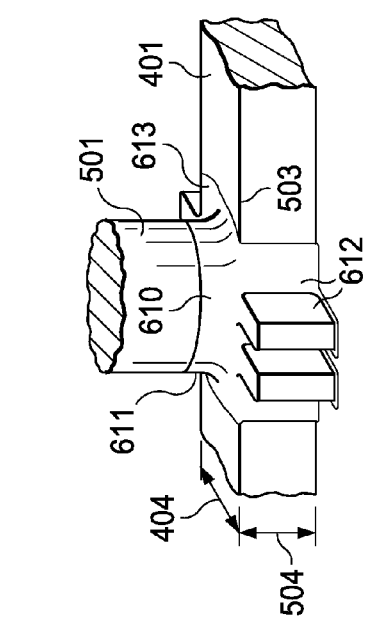
FIG. 5 is a perspective view of the configuration of FIG. 4, depicting the sidewalls of the bulge configured according to the invention.
Figure 6:
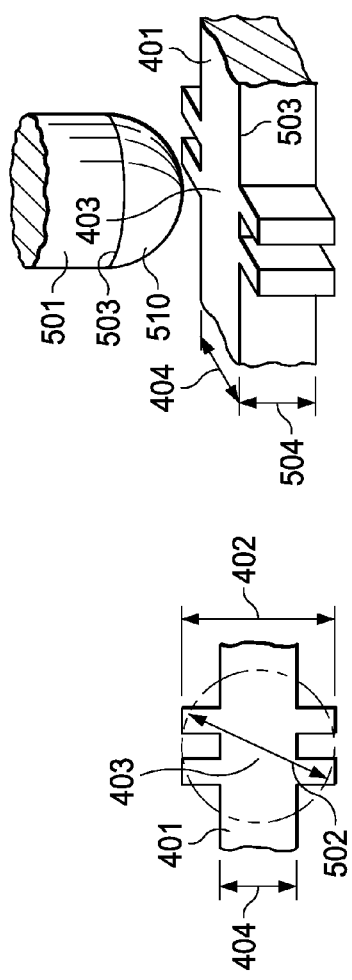
FIG. 6 illustrates object and trace of FIG. 5 in contact after the solder reflowed, depicting vertical solder wicking at the sidewalls of the trace bulge configured according to the invention.

In order to highlight the advantages of the invention, FIGS. 4, 5, and 6 illustrate an embodiment of a contact formation, which compares with regard to certain configurations with the example of conventional technology discussed in FIGS. 1, 2, and 3. A trace 401 of width 404 and height 504 is laid out horizontally; it may be supported by a substrate. Trace 401 may be made of metal, for instance copper, aluminum or composite metal layers; alternatively, trace 401 may have a core of low electrical conductivity and surface layers of high electrical conductivity; or trace may be made altogether of electrically insulating material. However, in any case the surface of trace 401 is solderable. Trace width 404 may be 20 μm or less; trace height 504 may be about 17 μm.

Trace 401 is to be contacted by a pillar 501 of diameter 502; the pillar is oriented about vertically relative to trace 401. Pillar 501 may be made of metal, for instance copper, aluminum or composite metal layers; alternatively, pillar 501 may have a core of low electrical conductivity and surface layers of high electrical conductivity; or trace may be made altogether of electrically insulating material. However, in any case the surface of pillar 501 is solderable. Width 404 and diameter 502 are selected so that diameter 502 is significantly wider than width 404. In the example wherein width 404 is about 20 μm, diameter 502 may be about 30 μm.

As FIGS. 4, 5 and 6 illustrate, trace 401 includes a bulge 403 of diameter 402 greater than trace width 404. Preferably, bulge 403 has a diameter 402 approximately identical to pillar diameter 502; in the exemplary embodiment of FIG. 4, bulge diameter 402 is about 30 μm. As FIGS. 4, 5, and 6 show, bulge 403 has preferably a perimeter so that a plurality of sidewalls of height 504 are created. The outline of the perimeter defines the surface area of bulge 403; it also defines the size of each bulge sidewall area and the number of bulge sidewalls. By adding together the bulge sidewall areas, the sum of the bulge sidewall areas can be determined. It is preferred that the bulge perimeter is selected so that the sum of the bulge sidewall areas is comparable to, and preferably no less than, the bulge surface area.

In the exemplary embodiment of FIGS. 4, 5 and 6, the perimeter of the bulge 403 has a meandrous contour with a general diameter 502 as illustrated in FIG. 4. When the trace height 504 is 17 μm and the bulge diameter 402 is 30 μm, the exemplary bulge outline of FIG. 5 results in a sum of bulge surface area and bulge sidewall areas of 1900 μm². This indicates that the sum of the bulge sidewall areas is larger than the bulge surface area. Other contour examples are discussed in FIGS. 7A and 7B. Experiments have shown that for maximizing solder contact strength (see below) the sum of the bulge sidewall areas should preferably be no less than the bulge surface area.

When solder is used as a means for creating the contact between pillar 501 and trace 401, the needed solder is preferably supplied as a cap 510 on the end 503 of pillar 501. First, pillar 501 is positioned over trace 401 and aligned with bulge 403. Next, the solder cap is brought into contact with the surface of bulge 403. Then, thermal energy is provided in order to liquefy the solder. Pulled by adhesive forces of the solderable trace surface (wicking), the liquified solder tends to spread across the surface and the sidewalls of the bulge, with hardly any solder left for spreading sidewise along the surface 503 of the trace. FIG. 6 depicts the resulting contact formed by solder 610 between pillar 501 and trace 401: Solder 611 forms a continuous connection between pillar 501 and the bulge surface, without the formation of a narrow neck; solder 612 has spread vertically over the bulge sidewalls and adheres to the sidewall surfaces, incorporating the sidewalls into the contact between pillar and the trace; solder 613 has spread negligibly sidewise along surface 503 and thus little solder is lost for the contact.

In contrast to FIG. 3, where the trace is about as wide as the pillar and much solder has a chance to spread sidewise and thus to be lost for contact formation, the contact illustrated in FIG. 6 uses a narrow trace combined with a bulge approximately as wide as the pillar. As a consequence, only little solder is lost sidewise and instead the solder is contained for adhering to the vertical bulge sidewalls, thereby including the sidewalls into the contact formation. While the contact in FIG. 3 only two-dimensional, the contact in FIG. 6 is three-dimensional, and consequently much more reliable and stronger.

Experimental investigations have confirmed the strong improvements of the contact strength by including the third dimension into the connection anchoring. In one set of the experiments, cuboid-shaped semiconductor chips of 7.3 by 7.3 by 0.15 mm dimensions have been employed; the chips had 544 pins at 50 μm pitch in peripheral interconnection. The connection involved copper pillars of 30 μm diameter with tin/silver solder caps of 15 μm height; the copper traces of the substrate had a width of 20 μm with bulges of 30 μm diameter and sidewall areas doubling the bulge surface area. With solder attached to the sidewall areas and thus the pillar-to-trail connections fortified by solder attachments in the third dimension, shear tests revealed a 27% increase in bond strength compared to control units displaying solder wicking on the trace surface. Further, pull tests showed a shift to about 33% breakage of the chip metallization and 67% cracking of the solder connection, compared to 100% cracking of the solder connection in the control units.

Figure 7A:
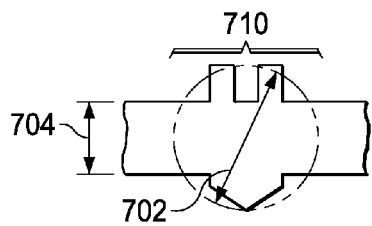
FIG. 7A shows an alternative configuration of trace bulge as another embodiment of the invention.
Figure 7B:
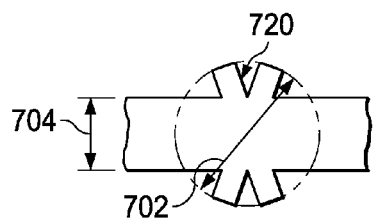
FIG. 7B shows another alternative configuration of trace bulge as another embodiment of the invention.

FIGS. 7A and 7B depict a few other successful embodiments for designing bulges with a diameter 702 greater than the trace width 704. In all cases, the bulge is intended to enhance the attachment of a pillar with a diameter about equal to the bulge diameter, especially when using reflowed solder. In all cases, the sidewall areas of the bulge add solder attachment areas of approximately the same size as the surface area of the bulge. The improvements of contact strength has been confirmed for pillars with a round cross section, a square cross section, and an elongated cross section (rectangular, oval, elliptical), wherein the elongation is preferably oriented along the long axis of the trace.

With the improvement of solder strength, the pillar diameter and the solder joint thickness can continue downward scaling—an ongoing trend for semiconductor devices.

In FIG. 7A, the trace protrusions of the bulge are unsymmetrical and only the portion of the bulge surface area designated 710 has a meandrous contour. In FIG. 7B, the meandrous contour of the trace protrusions involves angles 720 smaller than normal angles. In solder experiments using bulge configurations like FIGS. 7A and 7B, as well as in experiments using a variety of other bulge configurations, solder readily utilized the additional surfaces for vertical spreading and attachment. As a result, the solder connections significantly increased strength.

It should be pointed out that the advantages of a bulge with contoured perimeter for increasing solder contact strength by three-dimensional solder flow hold not only for traces, wherein trace width and trace height are about equal, but also for any aspect ratio between trace width and trace height.

Figure 8:
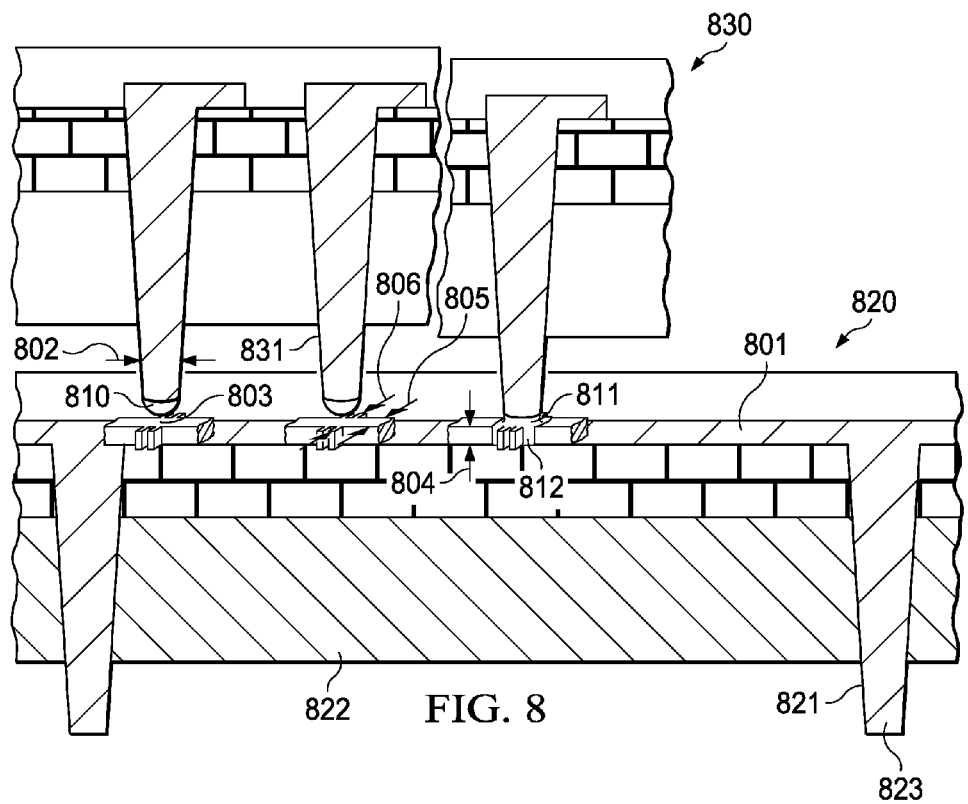
FIG. 8 illustrates another embodiment of bulges for traces on a TSV chip.

FIG. 8 illustrates an embodiment, wherein the solderable traces designed with bulges for solder connection are traces on a Through-Silicon-Via (TSV) chip 820 and the solderable objects are the studs (tips) 831 of the metal fillings of another TSV chip 830 aligned with TSV chip 820. (In other embodiments, the solderable objects are pillars similar to the ones described in FIGS. 1 to 6). TSV chip 820 has via holes 821 penetrating the semiconductor chip 822 from the chip top surface to the chip bottom surface; the holes are filled with metal 823, which has extensions of the via metallization by metal layers 801 on the top chip surface. The preferred metal 823 for the vias and the layers 801 is copper or a copper alloy. Preferably, the TSVs in chip 830 have a cylindrical shape with uniform diameter 802, but may in some embodiments have the shape of a truncated cone, as shown in FIG. 8. In other embodiments, the cross section of via holes may be rectangular, hexagonal, or in any other outline compatible with the crystalline orientation of the semiconductor material. The preferred diameter 802 of the metal filling protruding as stud 831 from the TSV is in the range from about 10 to 40 µm. On order to render the protruding tip of the copper or other metal filling of the via hole solderable, it is preferred to deposit a layer nickel and a layer of palladium over the protruding metal tip, before a cap 810 of solder is deposited.

In the example of FIG. 8, metal layer 801 on the chip surface has a solderable surface and is patterned into a trace of height 804 and a width 805. Further, layer 801 includes bulges 803 with a diameter 806 greater than trace width 805. Bulge 803 has a surface area and, due to the patterned outline, a plurality of sidewall areas adding up to a summary area, which is preferably no less than the bulge surface area.

Diameter 802 of metal stud 831 is greater than trace width 805. After the reflow of solder 810, the solder adheres not only to the bulge surface area, but also to the bulge sidewall areas, as schematically indicated in one drawing detail of FIG. 8. Solder 811 forms a continuous connection between stud 831 and the bulge surface, without the formation of a neck; solder 812 spreads vertically over the bulge sidewalls and adheres to the sidewall surfaces.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to traces with bulge surface areas having meandrous contours, but also to bulges contoured as diamonds, stars, crosses, ellipses, and combinations thereof, with bulge diameters approximately equal to the pillar diameter, wherein the pillar diameter is greater than the trace width.

It is therefore intended that the appended claims encompass any such modifications or embodiments.

I claim:

1. An apparatus comprising:
   a trace having a solderable surface, a height, and a width, the trace including a bulge having a diameter greater than the trace width, a surface area, and sidewalls, the sum of the bulge sidewall areas being no less than the bulge surface area and wherein at least a portion of the bulge surface area has a meandrous contour; and
   a solderable object having a diameter greater than the trace width, one end of the object soldered to the bulge, wherein the solder adheres to the bulge surface area and to the bulge sidewall areas.

2. The apparatus of claim 1 wherein the sum of the bulge side wall areas is no less than the bulge surface area.

3. The apparatus of claim 1 wherein the trace height is about equal to the trace width.

4. The apparatus of claim 3 wherein the trace is an electrical conductor.

5. The apparatus of claim 4 wherein the trace includes copper.

6. The apparatus of claim 5 wherein the trace is supported by a semiconductor integrated circuit chip.

7. The apparatus of claim 6 wherein the chip includes metal-filled through-silicon-vias.

8. The apparatus of claim 1 wherein the diameter of the object is no less than the diameter of the bulge.

9. The apparatus of claim 1 wherein the object is shaped as an electrically conductive bump with a diameter.

10. The apparatus of claim 1 wherein the object is shaped as an elongated, electrically conductive pillar with a diameter.

11. The apparatus of claim 10 wherein the object is the metallic core of a metal-filled TSV (through-silicon-via).

12. The apparatus of claim 1 wherein the opposite end of the object is attached to a bond pad of a semiconductor chip.

13. An apparatus comprising:
   a trace having a solderable surface, a height, and a width, the trace including a bulge having a diameter greater than the trace width, a surface area, and sidewalls, the sum of the bulge sidewall areas being no less than the bulge surface area, wherein the trace is supported by a semiconductor integrated circuit chip having metal-filled through-silicon-vias; and a solderable object having a diameter greater than the trace width, one end of the object soldered to the bulge, wherein the solder adheres to the bulge surface area and to the bulge sidewall areas.

14. An apparatus comprising:

a trace having a solderable surface, a height, and a width, the trace including a bulge having a diameter greater than the trace width, a surface area, and sidewalls, the sum of the bulge sidewall areas being no less than the bulge surface area; and a solderable metallic core of a metal-filled TSV (through-silicon-via) having a diameter greater than the trace width, one end of the metallic core of a metal-filled TSV (through-silicon-via) soldered to the bulge, wherein the solder adheres to the bulge surface area and to the bulge sidewall areas.

* * * * *